US011109667B2

(12) United States Patent
Ku et al.

(10) Patent No.: US 11,109,667 B2
(45) Date of Patent: Sep. 7, 2021

(54) DEVICE OF BI-SPIRAL CLEANING BRUSH

(71) Applicant: Tung An Development Ltd., Hsinchu County (TW)

(72) Inventors: Chih-An Ku, Hsinchu County (TW); Tzu-Yen Chuang, Hsinchu County (TW); Hung-Chieh Chao, Hsinchu County (TW); Fu-Qiang Zhang, Hsinchu County (TW)

(73) Assignee: Tung An Development Ltd., Hsinchu County (TW)

(*) Notice: Subject to any disclaimer, the term of this patent is extended or adjusted under 35 U.S.C. 154(b) by 148 days.

(21) Appl. No.: 16/654,065

(22) Filed: Oct. 16, 2019

(65) Prior Publication Data

US 2021/0112961 A1 Apr. 22, 2021

(51) Int. Cl.

| | |
|---|---|
| ***A46B 9/02*** | (2006.01) |
| ***B08B 1/00*** | (2006.01) |
| ***B08B 1/04*** | (2006.01) |
| ***B08B 3/04*** | (2006.01) |
| ***A46B 9/00*** | (2006.01) |
| ***G03G 21/00*** | (2006.01) |
| ***A46B 13/00*** | (2006.01) |
| ***H01L 21/67*** | (2006.01) |

(52) U.S. Cl.

CPC .............. *A46B 9/025* (2013.01); *A46B 9/005* (2013.01); *A46B 9/026* (2013.01); *A46B 13/001* (2013.01); *B08B 1/002* (2013.01); *B08B 1/04* (2013.01); *B08B 3/04* (2013.01); *G03G 21/0058* (2013.01); *H01L 21/67046* (2013.01); *A46B 2200/30* (2013.01)

(58) Field of Classification Search

CPC ......... A46B 9/025; A46B 9/005; A46B 9/026; A46B 13/001; B08B 1/002; B08B 1/04; B08B 3/04; G03G 21/0058; H01L 21/67046

See application file for complete search history.

(56) References Cited

U.S. PATENT DOCUMENTS

| | | | | |
|---|---|---|---|---|
| 10,758,946 | B2 * | 9/2020 | Ku | B08B 1/04 |
| 10,790,167 | B2 * | 9/2020 | Patel | B08B 1/002 |
| 2008/0244852 | A1 * | 10/2008 | Alton | A46B 13/02<br>15/179 |

* cited by examiner

*Primary Examiner* — Shay Karls

(74) *Attorney, Agent, or Firm* — Demian K. Jackson; Jackson IPG PLLC

(57) ABSTRACT

A cleaning brush is provided. A cleaning unit comprises cleaning beans fixed on a surface of the carrier in a bi-spiral arrangement. The cleaning beans are arranged in an unequally-spaced manner on center of the carrier along a baseline; and, thus, bi-spirals are formed on the center and coiled in two different outward directions. Two annular spiral curve paths are formed with the cleaning beans as coiling the carrier and extending along the two directions. When the carrier cleans an electronic device, a solution or cleaning agent is discharged along the curve paths in spiral tangential directions. Hence, the bi-spiral cleaning unit obtains positive and negative directions on rotating to create a plurality of flow fields. Dirt is discharged easily with water distribution enhanced as compared to unidirectional spiral cleaning devices while a large contact surface, a good cleaning efficiency, and a high decontamination ratio are achieved.

7 Claims, 2 Drawing Sheets

100

2
22
24
23
21
1
11
101

DEVICE OF BI-SPIRAL CLEANING BRUSH

TECHNICAL FIELD OF THE INVENTION

The present invention relates to a cleaning brush; more particularly, during a cleaning motion, to applying a bi-spiral way to push dirt with directivity from center toward two outward ends for providing more effective cleaning efficiency and effectively improving water distribution.

DESCRIPTION OF THE RELATED ARTS

A first prior art for cleaning precision electronic components (such as silicon wafer, hard drive disk, semiconductor and CPU chip) is a general device made of an elastic porous sponge of polyvinyl acetal. Multiple protrusions are set on a lateral surface. The tops of the protrusions rotate and contact the surface of a to-be-cleaned object for cleaning. Therein, the protrusions are arranged into a matrix; and the top of each protrusion is formed of a surface layer having high smoothness. Thus, with the coordination of an actuator, the multiple protrusions on the surface are used to clean precision electronic components.

A second prior art comprises a rotatable base, which has an inner surface and an outer surface; and a porous pad material, which covers at least a portion of the outer surface of the rotatable base to be used for removing materials from a substrate. The porous pad material is combined with the rotatable base while protrusions are maintained in an alignment to on the surface of the porous pad material. Therein, the protrusions appear in a matrix arrangement on the surface of the porous pad material. Thus, with the coordination of an actuator, the protrusions are used to clean precision electronic components.

A third/fourth prior art comprises a carrier/brush; and a plurality of cleaning units/nodules, which are set on the surface of the carrier/brush in a matrix arrangement and whose end surfaces are cambered/concave. Thus, the cleaning units/nodules use their cambered/concave surfaces to achieve dirt removal with large contact area, quick cleaning efficiency and high effectivity.

All of the four prior arts are provided to clean precision electronic components. But, because the third prior art uses its protrusions in a matrix arrangement with their tops formed into surfaces having high smoothness as flat planes and the second prior art also has its protrusions formed into flat planes in a matrix arrangement, the above two prior arts do not effectively contact the precision electronic components whose surfaces are irregular. Besides, although the first and fourth prior arts use their cleaning units/nodules having the cambered/concave surfaces on their tops to effectively contact the precision electronic components having irregular surfaces, the cleaning units/nodules are still formed with a matrix arrangement. Thus, the above four prior arts may easily make particles spraying non-directionally during cleaning. Not only the particles are not removed directionally, but also they might be trapped between the cleaning units and the precision electronic components, not to mention the damages thus caused to the precision electronic components.

In addition, a fifth prior art uses a spiral cleaning unit comprising a plurality of cleaning beans fixed on a surface of a carrier in a spiral arrangement. During a horizontal cleaning motion, dirt of particles are pushed from one side to the other. Effective cleaning efficiency is provided more than that for a conventional matrix-structured device. However, the spiral structure of the cleaning unit is a uni-spiral one, so that the dirt is pushed uni-directionally and horizontally with a flow forming only one field distribution.

Hence, the prior arts do not fulfill all users' requests on actual use.

SUMMERY OF THE INVENTION

The main purpose of the present invention is to provide a cleaning unit comprising a plurality of cleaning beans fixed on a surface of a carrier in a bi-spiral arrangement, where the cleaning beans are arranged in an unequally-spaced manner at center of the carrier along a baseline for obtaining positive and negative directions on rotating; the bi-spiral cleaning unit generates a number of flow fields while, in addition to a perpendicular direction, a transverse direction toward an object to be cleaned is obtained; the flow fields are introduced by pushing a solution from the center to the different directions outwardly; and, thus, dirt can be discharged more easily than traditional matrix cleaning devices with water distribution enhanced as compared to unidirectional spiral cleaning devices while a large contact surface, a good cleaning efficiency, and a high decontamination ratio are achieved.

To achieve the above purpose, the present invention is a device of bi-spiral cleaning brush, comprising a carrier and a bi-spiral cleaning unit, where the carrier has a cylindrical shape; a sleeve unit is set in center of the carrier; the sleeve unit is assembled with an actuating device; the bi-spiral cleaning unit comprises a plurality of cleaning beans fixed on a surface of the carrier in a bi-spiral arrangement; the cleaning beans are arranged in an unequally-spaced manner on the center of the carrier along a baseline; with the cleaning beans, a plurality of bi-spirals are formed to spirally coil the center of the carrier toward two outward ends in different directions; two annular spiral curve paths are formed with the cleaning beans to coil the carrier and extend on the center toward the two outward ends circumferentially; and, on carrying the carrier by the actuating device to clean an electronic device with the cleaning beans, a solution or cleaning agent attached to the carrier is discharged along the annular spiral curve paths in a plurality of spiral tangential directions. Accordingly, a novel device of bi-spiral cleaning brush is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
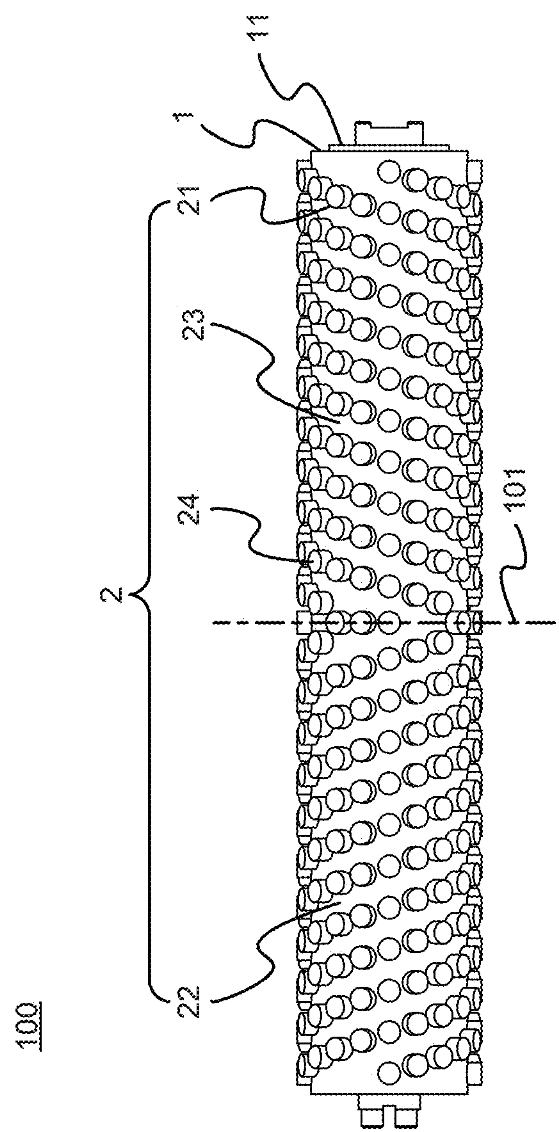
FIG. 1 is the view showing the preferred embodiment according to the present invention.
Figure 2:
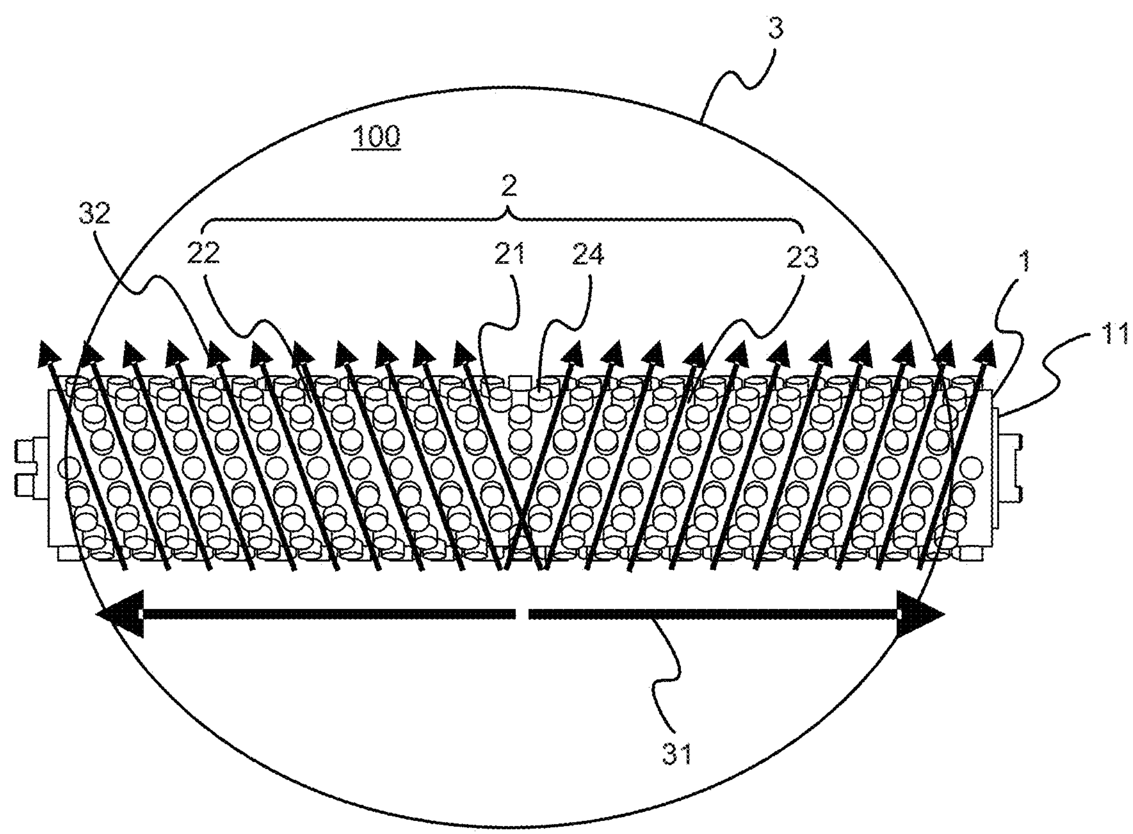
FIG. 2 is the view showing the state-of-use.

Please refer to FIG. 1 and FIG. 2, which are a view showing a preferred embodiment according to the present invention; and a view showing a state-of-use. As shown in the figures, the present invention is a device of bi-spiral cleaning brush 100, comprising a carrier 1 and a bi-spiral cleaning unit 2. Therein, according to a given request, the carrier 1 and the bi-spiral cleaning unit 2 use different polymer materials like a composite, sponge, polyurethane (PU), polyvinyl alcohol (PVA) and/or a polymer material as soft foams to be foamed and formed integrally.

The carrier 1 has a cylindrical shape, where a sleeve unit 11 is set in center to be assembled with an actuating device (not shown in the figure).

The bi-spiral cleaning unit 2 is disposed on an outer edge of the carrier 1 and comprises a plurality of cleaning beans 21 fixed on a surface of the carrier 1 in a bi-spiral arrangement, where the cleaning beans 21 are arranged in an unequally-spaced manner on the center of the carrier 1 along a baseline 101; the baseline 101 is a straight line; and an axial direction of the carrier 1 is perpendicular to the baseline 101. With the cleaning beans 21, a plurality of bi-spirals are formed to spirally coil the center of the carrier 1 toward two outward ends in different directions; the cleaning beans 21 are protruded out a certain distance from the surface of the carrier 1; two annular spiral curve paths 22,23 are formed with the cleaning beans 21 to coil the carrier 1 and extend on the center toward the two outward ends circumferentially; an end surface of each one of the cleaning beans 21 is concaved at center to obtain a concave arc 24; the concave arc 24 has a curvature of 70-99 percent (%); and each one of the cleaning beans 21 has a pillar shape or a polygonal shape. Thus, a novel device of bi-spiral cleaning brush is obtained.

On using the present invention, one or a plurality of carriers 1 are assembled with a related actuating device (not shown in the figure) by using the sleeve unit 11, so that the actuating device carries the carriers 1 to roll and moves according to a requested cleaning condition and the position of the actuating device for making the cleaning beans 21 of the bi-spiral unit 2 on the outer edge of the carrier 1 in touch with the surface of a related precision electronic device 3 for cleaning. In a state-of-use as shown in FIG. 2, on moving for cleaning, the precision electronic device 3 (e.g. wafer) is supposed to rotate in a clockwise or counterclockwise direction at an original position. The cylindrical carrier 1 having the bi-spiral cleaning unit 2 rotates as well. The bi-spiral cleaning unit 2 spirally coiled in different directions pushes dirt (e.g. particles) from the center of the carrier 1 toward the two outward ends by using the two annular spiral curve paths 22,23 formed with the cleaning beans 21 coiling the carrier 1 and extending on the center toward the two outward ends circumferentially (as shown by the first arrows 31 in FIG. 2), so that the dirt is pushed with directivity from the center for providing more effective cleaning efficiency. A solution or cleaning agent attached to the carrier 1 is discharged along the annular spiral curve paths 22,23 in a plurality of spiral tangential directions (as shown by the second arrows 32 in FIG. 2), so that water distribution is improved for achieving significant reduction in trapped particles between the cleaning brush 100 and the electronic device 3. In addition, the concave arc 24 set on the end surface of each one of the cleaning beans 21 has a curvature between 70% to 99%, so that, by using the cleaning beans 21, a large contact surface, a good cleaning efficiency, and a high decontamination ratio are achieved.

To sum up, the present invention is a device of bi-spiral cleaning brush, where a cleaning unit comprises a plurality of cleaning beans fixed on a surface of a carrier in a bi-spiral arrangement; the cleaning beans are arranged in an unequally-spaced manner at center of the carrier along a baseline for obtaining positive and negative directions for rotating; the bi-spiral cleaning unit generates a number of flow fields while, in addition to a perpendicular direction, a transverse direction toward the object to be cleaned is obtained; the flow fields are introduced by pushing a solution from the center to the different directions outwardly; and, thus, dirt is discharged more easily than traditional matrix cleaning devices with water distribution enhanced as compared to unidirectional spiral cleaning devices.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A device of bi-spiral cleaning brush comprising:

a carrier having a cylindrical shape;

a sleeve unit arranged along a center axis of and within said carrier;

an actuating device assembled with the sleeve unit; and a bi-spiral cleaning unit comprising a plurality of cleaning beans fixed on a surface of said carrier in an unequally-spaced manner with said cleaning beans arranged in two annular spiral curve paths extending from a baseline plane bisecting the carrier toward two outward ends, wherein, on driving said carrier by said actuating device to clean an electronic device with said cleaning beans, a liquid is discharged along said annular spiral curve paths in a plurality of spiral tangential directions outwardly from the baseline.

2. The device according to claim 1, wherein an end surface of each one of said cleaning beans is concaved at center to obtain a concave arc; and said concave arc has a curvature of 70-99 percent (%).

3. The device according to claim 1, wherein said carrier and said bi-spiral cleaning unit are foamed to be integrally formed.

4. The device according to claim 1, wherein each one of said cleaning beans has a pillar shape.

5. The device according to claim 1, wherein each one of said cleaning beans has a polygonal shape.

6. The device according to claim 1, wherein each one of said cleaning beans has a shape selected from a group consisting of a pillar shape and a polygonal shape.

7. The device according to claim 1, wherein said cleaning beans are protruded out a certain distance from said surface of said carrier.

* * * * *